(12) United States Patent
Patterson

(10) Patent No.: US 11,612,070 B1
(45) Date of Patent: Mar. 21, 2023

(54) TELEVISION CABLE MANAGEMENT APPARATUS

(71) Applicant: Virginia Patterson, North Chesterfield, VA (US)

(72) Inventor: Virginia Patterson, North Chesterfield, VA (US)

( * ) Notice: Subject to any disclaimer, the term of this patent is extended or adjusted under 35 U.S.C. 154(b) by 0 days.

(21) Appl. No.: 17/397,809

(22) Filed: Aug. 9, 2021

(51) Int. Cl.
*H05K 5/02* (2006.01)

(52) U.S. Cl.
CPC ......... *H05K 5/0247* (2013.01); *H05K 5/0243* (2013.01)

(58) Field of Classification Search
CPC .................... H05K 5/0247; H05K 5/0243
See application file for complete search history.

(56) References Cited

U.S. PATENT DOCUMENTS

| | | | |
|---|---|---|---|
| 4,856,658 A | 8/1989 | Novak | |
| 7,098,406 B1 * | 8/2006 | Hammonds | B65H 75/06 242/388 |
| 7,973,242 B2 | 7/2011 | Jones | |
| 10,103,531 B1 * | 10/2018 | Ruhnke | H02G 3/081 |

FOREIGN PATENT DOCUMENTS

| | | | | |
|---|---|---|---|---|
| FR | 2860651 A1 * | 4/2005 | ............ | H01R 13/72 |
| WO | WO-2012109716 A1 * | 8/2012 | ............ | H02G 3/081 |

\* cited by examiner

*Primary Examiner* — Anthony Q Edwards
*Assistant Examiner* — Bryan Van Huynh
(74) *Attorney, Agent, or Firm* — Sanchelima & Associates, P.A.; Christian Sanchelima; Jesus Sanchelima

(57) ABSTRACT

A television cable management apparatus including a housing assembly and an internal compartments assembly. The housing assembly includes 3 equally spaced apart holes, a bottom and four lateral walls defining a container with opening atop. The 3 equally spaced holes are in one of the four lateral walls of the housing. The internal compartments assembly includes cutouts, cylindrical members and at least one transversal wall. The at least one transversal wall is placed in the housing defining a left compartment and a right compartment. The left compartment is used to store remote controls and the right compartment is used to organize cables. The cables go through the 3 equally spaced apart holes and rest in the cutouts. The cylindrical members are placed in an interior face of one of the four lateral walls. The cylindrical members are used to wind cables therein.

6 Claims, 3 Drawing Sheets

TELEVISION CABLE MANAGEMENT APPARATUS

BACKGROUND OF THE INVENTION

The present invention relates to a television cable management apparatus and, more particularly, to such an apparatus that houses the television cables and accessories.

DESCRIPTION OF THE RELATED ART

Several designs for television cable management apparatuses have been designed in the past. None of them, however, include a compact and volumetrically efficient apparatus that is easy to use.

Applicant believes that a related reference corresponds to U.S. Pat. No. 7,973,242 issued for a vertical cable management for routing cables and wires. Applicant believes that another related reference corresponds to U.S. Pat. No. 4,856,658 issued for a remote control holder assembly. However, they differ from the present invention because, none of them include a housing with internal compartments and lateral grooves to accommodate remote controls, a surge protector, cutouts for passing cables from the interior of the housing and cylindrical members to wind cables.

Other documents describing the closest subject matter provide a number of more or less complicated features that fail to solve the problem in an efficient and economical way. None of these patents suggest the novel features of the present invention.

SUMMARY OF THE INVENTION

It is one of the objects of the present invention to provide a television cable management apparatus that is compact and volumetrically efficient.

It is another object of the present invention to provide a television cable management apparatus that is used to store, manage and hide cables, remotes and surge protectors in predetermined locations hidden from the users' view.

It is still another object of this invention to provide such an apparatus that is inexpensive to implement and maintain while retaining its effectiveness.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists of the details of construction and combination of parts as will be more fully understood from the following description, when read in conjunction with the accompanying drawings in which:

FIG. 4 is a representation of an isometric view of the present invention 10. In the present embodiment, the at least one transversal wall 42 is closer to the left end. The at least two cutouts 46 are at the front wall 22b and the equally spaced holes 48 at the rear wall 22a.

DETAILED DESCRIPTION OF THE EMBODIMENTS OF THE INVENTION

Figure 1:
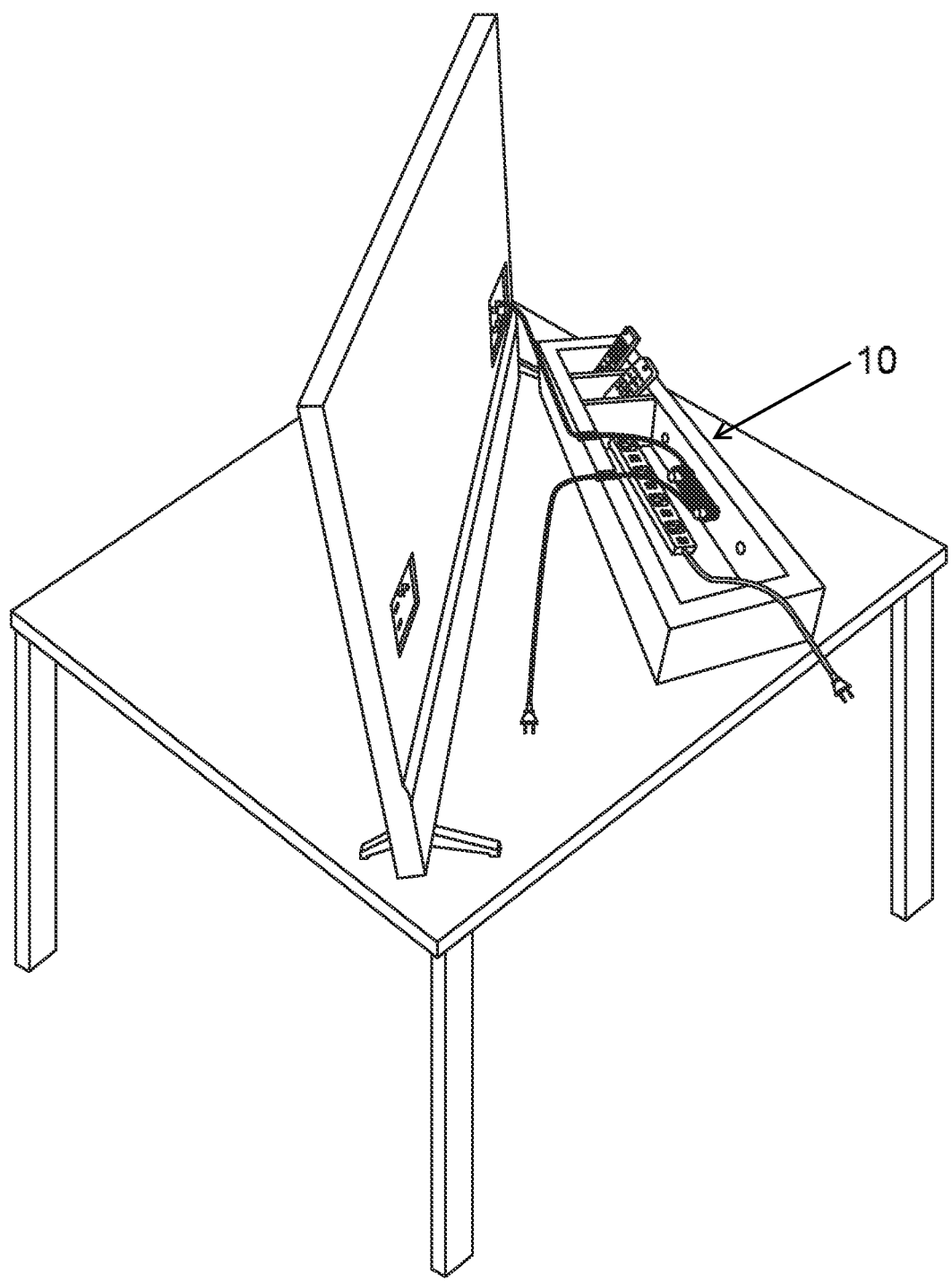
FIG. 1 represents an inclined view of one of the preferred embodiments of the present invention 10 showing the disposition of the cables and accessories housed therein.

Referring now to the drawings, where the present invention is generally referred to with numeral 10, it can be observed that it basically includes a housing assembly 20, and an internal compartments assembly 40. It should be understood there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

Figure 3:
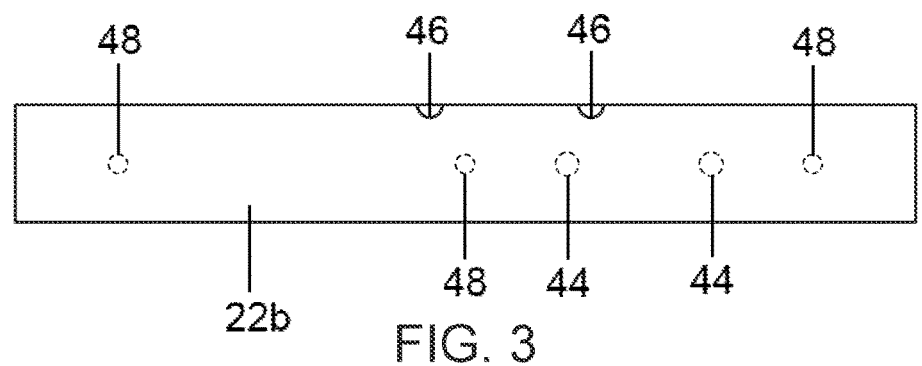
FIG. 3 illustrates a front view of the present invention 10, showing features such as the at least two cutouts 46 and hidden lines of the equally spaced holes 48.
Figure 4:
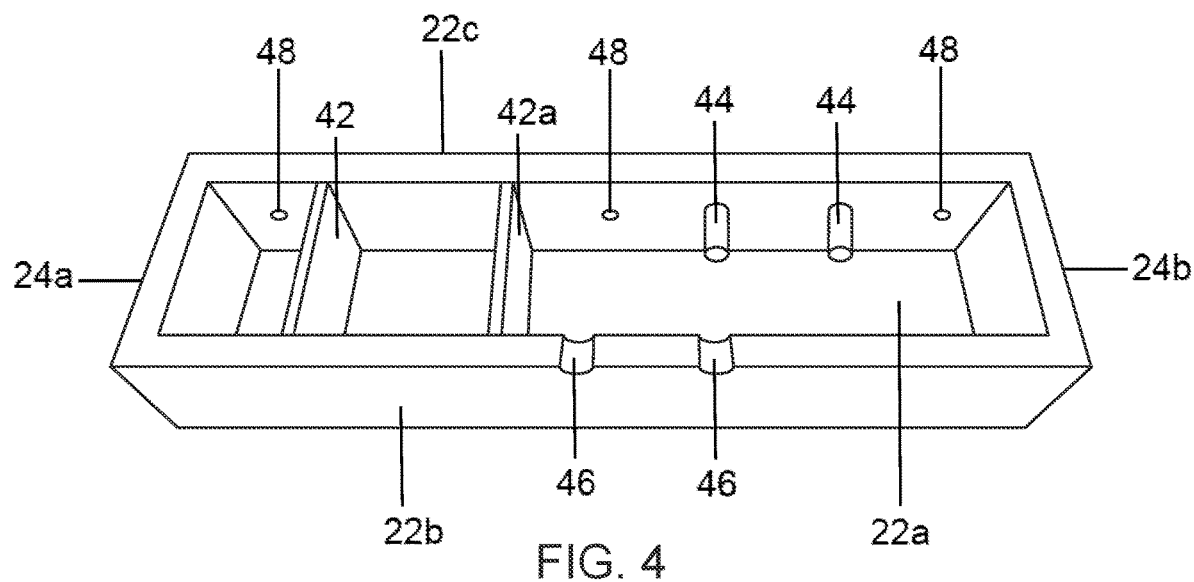

Best illustrated in FIGS. 1, 3 & 4 the housing assembly 20 may include a bottom 22a, a front wall 22b and a rear wall 22c, a left wall 24a and a right wall 24b. In one embodiment, the bottom 22a, the front wall 22b and the rear wall 22c may come in different length sizes to accommodate as many features as a user requires. The bottom 22a, the front wall 22b and the rear wall 22c may be perpendicularly mounted to one another about their respective lateral edges to define a rectangular shape. Wherein the rectangular shape includes an open top portion. In one embodiment, the bottom 22a may be placed and fixed between the front wall 22b and the rear wall 22c to conform to the profile of the left wall 24a and right 24b. The left wall 24a may be mounted and fixed at the left side of the bottom 22a, the front wall 22b and the rear wall 22c fixed together. The right wall 24b may be mounted and fixed at the right side of the bottom 22a, the front wall 22b and the rear wall 22c fixed together. In one embodiment the left wall 24a and the right wall 24b may be substantially compact in order for the present invention 10 to be able to be hidden at the back of a television or mounted on a wall. One of the walls, that may be the front wall 22b or the rear wall 22c, may have at least two cutouts 46, and the opposite wall three equally spaced holes 48. The at least two cutouts 46 may be substantially U shaped cutoffs or any other kind of cutoff suitable for cables to be wrap around the at least two cutouts 46 without causing any damage to cables. It may be preferable for the edges of the at least two cutouts 46 to be chamfered in order to avoid inflicting any wound to the hands of a user and to avoid snagging or damaging the cable as it is wrapped around the two cutouts 46. Furthermore, the three equally spaced holes 48 may be used to fasten the present invention 10 to a wall behind a television via nails or any other kind of fastening method thereof.

Figure 2:
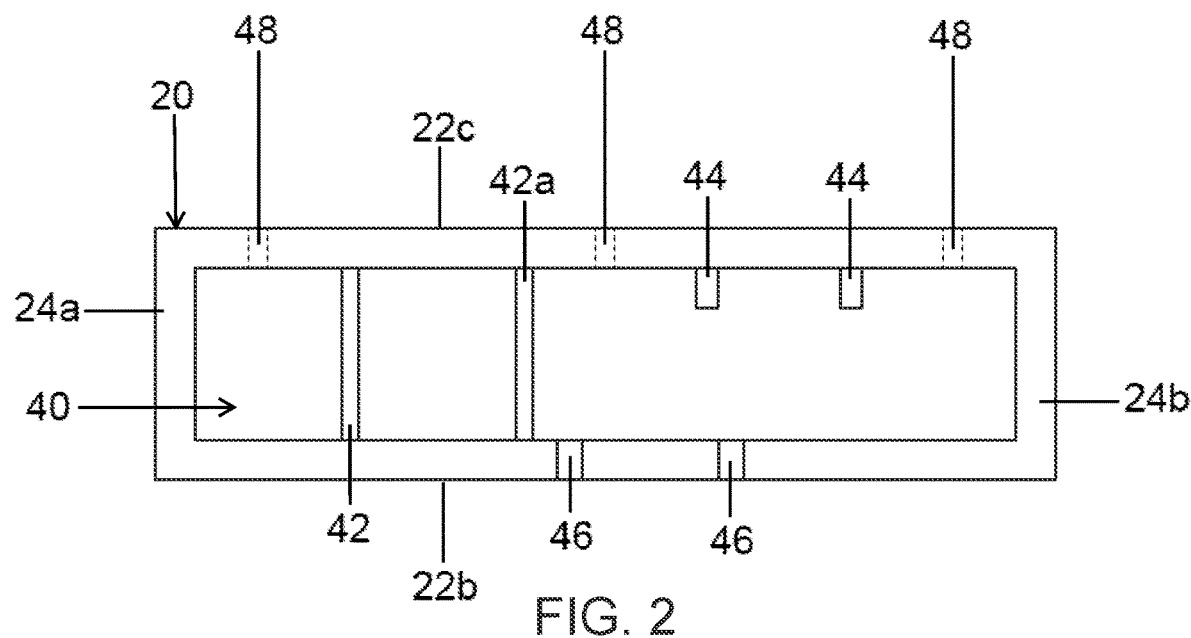
FIG. 2 shows a top view of the present invention 10, showing inside features wherein the at least one transversal wall 42 divides internal compartments. On the left compartment may be for a device such as a remote and the right compartment wherein the cylindrical members 44 are mounted on the front wall 22b.

Best shown on FIGS. 1, 2 & 4 the internal compartments assembly 40 may include at least one transversal wall 42, and at least two cylindrical members 44. In one embodiment, the at least one transversal wall 42 may be mounted within the housing assembly 20 wherein the at least one transversal wall 42 may define a spacing to accommodate a remote and make a smaller compartment and a larger compartment division for a device such as a surge protector. In one embodiment, inside the larger compartment, the at least two cylindrical members 44 may be mounted inline and apart from each other. Wherein the cutouts 46 may be at the front wall 22b of the housing assembly 20 and throughout the rear wall 22c, the three equally spaced holes 48. It may be suitable for the at least two cylindrical members 44 to have a circular profile in order for the cables to be wrap around the at least two cylindrical members 44 with ease and without damaging the cables.

In one embodiment, the bottom 22a, the front wall 22b, the rear wall 22c, the left wall 24a, the right wall 24b, the at least one transversal wall 42 and the at least two cylindrical members 44 may be made of lightweight plastic, wood, sheet metal, polyurethane or any other variation thereof. Depending on the material used, the fastening method may be of fastening members such as nails or the walls may be glued together, or any other kind of fastening method that is easy on the material in order not to damage it and ruin the functionality of present invention 10.

In another embodiment the present invention 10 can accommodate one remote, one surge protector and the cables of a TV and the surge protector and the extension cable fed through the cutouts 46.

In yet another embodiment the present invention 10 can have more than one transversal wall 42 to accommodate many remotes such as a TV remote and a DVD player remote, and a surge protector. In such an instance, the present invention 10 may have two compartments for remotes, and one compartment for a device such as a surge protector, two transversal walls 42 & 42a, two cutouts 46, and three equally spaced holes 48.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A television cable management apparatus, comprising:
   a. a housing assembly including a bottom having a substantially rectangular shape and four lateral walls perpendicularly mounted to said bottom defining a space therein and an upper end on each of said four lateral walls, wherein said four lateral walls include a front wall, a rear wall, a left wall and a right wall, wherein said left wall and said right wall have a four inch square profile in order for said television cable management apparatus to be compact and volumetrically efficient, wherein said rear wall has at least 3 equally spaced apart holes along a length of the rear wall at the upper end of the rear wall; and
   b. an internal compartments assembly having at least one transversal wall defining a left compartment and a right compartment, wherein said right compartment including at least two cylindrical members mounted at a spaced apart relationship with respect to each other and perpendicularly to an inner surface of a rear wall of said right compartment and at least two cutouts on the upper end of said front wall so that cables can be cooperatively passed through said at least two cutouts, wherein said at least two cutouts are in the right compartment, wherein said at least two cutouts are chamfered, wherein said at least two cylindrical members extend a distance equal to a thickness of the four lateral walls, wherein u outer surface of said four lateral walls is plain, wherein said thickness of said four lateral walls is greater than a thickness of said at least one transversal wall, wherein said right compartment has a length greater than a length of said left compartment, wherein said at least 3 equally spaced apart holes have a diameter equal to a diameter of said at least two cylindrical members.

2. The housing assembly of claim 1 wherein said front wall and said rear wall have a length size equal to a length size of said bottom.

3. The housing assembly of claim 1 wherein said left wall and said right wall have a width size equal to a width size of said bottom.

4. The internal compartments assembly of claim 1 wherein said at least two cutouts have a substantially U-shape.

5. The internal compartments assembly of claim 1 wherein said at least one transversal wall includes a first transversal wall and a second transversal wall, wherein said first transversal wall is placed in said left compartment defining two sub compartments, wherein said left compartment including said two subcompartments is smaller in length than said right compartment, wherein said first transversal wall and said second transversal wall are parallel to each other.

6. A television cable management apparatus, consisting of:
   a. a housing assembly including a bottom having a substantially rectangular shape and four lateral walls perpendicularly mounted to said bottom defining a space therein and an upper end on each of said four lateral walls, wherein said four lateral walls include a front wall, a rear wall, a left wall and a right wall, wherein said left wall and said right wall have a four inch square profile in order for said television cable management apparatus to be compact and volumetrically efficient, wherein said rear wall has at least 3 equally spaced apart holes, wherein said front wall and said rear wall have a length size equal to a length size of said bottom, said left wall and said right wall have a width size equal to a width size of said bottom; and
   b. an internal compartments assembly having at least one transversal wall defining a left compartment and a right compartment, wherein said right compartment including at least two cylindrical members mounted at a spaced apart relationship with respect to each other and perpendicularly to an inner surface of a rear wall of said right compartment and at least two cutouts on the upper end of said front wall so that cables can be cooperatively passed through said at least two cutouts, said at least two cutouts have a substantially U-shape, said at least two cutouts are chamfered, wherein said at least two cutouts are in the right compartment, wherein said at least two cylindrical members extend a distance equal to a thickness of the four lateral walls, wherein an outer surface of said four lateral walls is plain, wherein said thickness of said four lateral walls is greater than a thickness of said at least one transversal wall, wherein said right compartment has length greater than a length of said left compartment, wherein said at least 3 equally spaced apart holes have a diameter equal to a diameter of said at least two cylindrical members, wherein said at least one transversal wall includes a first transversal wall and a second transversal wall, wherein said first transversal wall is placed in said left compartment defining two sub compartments, wherein said left compartment including said two subcompartments is smaller in length than said right compartment, wherein said first transversal wall and said second transversal wall are parallel to each other and said two sub compartments divide the length of said left compartment equally.

* * * * *